United States Patent
Hatakeyama

(10) Patent No.: US 10,423,035 B2
(45) Date of Patent: Sep. 24, 2019

(54) LIQUID CRYSTAL DISPLAY DEVICE AND MANUFACTURING METHOD THEREOF

(71) Applicant: Japan Display Inc., Tokyo (JP)

(72) Inventor: Eisuke Hatakeyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/183,788

(22) Filed: Nov. 8, 2018

(65) Prior Publication Data

US 2019/0072802 A1 Mar. 7, 2019

Related U.S. Application Data

(63) Continuation of application No. 15/342,223, filed on Nov. 3, 2016, now Pat. No. 10,175,541, which is a continuation of application No. 14/249,430, filed on Apr. 10, 2014, now Pat. No. 9,529,233.

(30) Foreign Application Priority Data

Apr. 11, 2013 (JP) .................................. 2013-083284

(51) Int. Cl.
*G02F 1/1339* (2006.01)
*H01L 27/12* (2006.01)
*G02F 1/1333* (2006.01)
*G02F 1/1335* (2006.01)

(52) U.S. Cl.
CPC ........ *G02F 1/13394* (2013.01); *G02F 1/1339* (2013.01); *G02F 1/133351* (2013.01); *G02F 1/133512* (2013.01); *G02F 1/133514* (2013.01); *H01L 27/1259* (2013.01); *G02F 2001/13398* (2013.01); *G02F 2001/133519* (2013.01)

(58) Field of Classification Search
CPC ........... G02F 1/13394; G02F 1/133351; G02F 1/133512; G02F 1/133514; G02F 1/1339; G02F 2001/133519; H01L 27/1259
USPC .................................................. 349/155–157
See application file for complete search history.

(56) References Cited

U.S. PATENT DOCUMENTS

| 6,010,384 | A | * | 1/2000 | Nishino | ................ C03B 33/076 |
| | | | | | 445/24 |
| 8,698,995 | B2 | | 4/2014 | Yoshida et al. | |
| 8,842,254 | B2 | | 9/2014 | Kaneko | |
| 2011/0007251 | A1 | | 1/2011 | Yamamoto et al. | |

(Continued)

FOREIGN PATENT DOCUMENTS

JP       2012-32506 A       2/2012

*Primary Examiner* — Charles S Chang
(74) *Attorney, Agent, or Firm* — Michael Best & Friedrich LLP

(57) ABSTRACT

It is possible to separate each liquid crystal display panel from a mother board in which multiple liquid crystal display panels are formed even with a thin glass substrate, by forming a columnar spacer in the boundary between liquid crystal display panels, forming a scribe line corresponding to the columnar spacer on both sides of the counter substrate and the TFT substrate in the mother board, and forming a separation line between the scribe lines by applying a bending stress to the mother board. Since the columnar spacer is formed in a portion corresponding to the scribe line, the strength in this portion increases, so that the proper scribe lines and break lines can be formed when the thickness of the glass substrate is reduced to about 0.15 mm.

11 Claims, 12 Drawing Sheets

(56) References Cited

U.S. PATENT DOCUMENTS

2012/0154734 A1 6/2012 Kaneko
2016/0004110 A1 1/2016 Imai et al.

* cited by examiner

A-A

B-B

A—A

B—B

LIQUID CRYSTAL DISPLAY DEVICE AND MANUFACTURING METHOD THEREOF

CROSS-REFERENCE TO RELATED APPLICATIONS

This application is a continuation of U.S. patent application Ser. No. 15/342,223 filed on Nov. 3, 2016, which, in turn, is a continuation of U.S. patent application Ser. No. 14/249,430 (now U.S. Pat. No. 9,529,233) filed on Apr. 10, 2014. Further, this application claims priority from Japanese Patent Application No. 2013-83284 filed on Apr. 11, 2013, the entire contents of which are hereby incorporated by reference into this application.

BACKGROUND

The present invention relates to a liquid crystal display device, and to a separation method for forming each liquid crystal display panel from a mother board with a thinner glass substrate.

A liquid crystal display panel used for a liquid crystal display device includes: a TFT substrate in which pixels with pixel electrodes, thin film transistors (TFTs) and the like are arranged in a matrix; and a counter substrate in which color filters are formed at positions corresponding to the pixel electrodes. The counter substrate is disposed opposite the TFT substrate with a liquid crystal between the two substrates. The liquid crystal is sealed by a sealing material to bond the TFT substrate and the counter substrate together. Then, an image is formed by controlling the amount of light transmitted through the liquid crystal molecules for each pixel.

The liquid crystal display device, which can be made small and thin, is used in various applications such as mobile phone and digital still camera (DSC). In such a small liquid crystal display device, there is a growing demand for thinner liquid crystal display panels. The thickness of the liquid crystal display panel is most influenced by the thickness of the glass substrate, such as the TFT substrate or the counter substrate. Thus, it is necessary to reduce the thickness of the glass substrate in order to make the liquid crystal display panel thin.

The thickness of the glass substrate is standardized, for example, to 0.5 mm in the market. It is difficult to obtain a glass substrate other than the standardized one from the market. Further, a very thin substrate is poor in mechanical strength in the manufacturing process, which may be warped and difficult to flow on the production line.

Since the production of each liquid crystal display panel is not efficient, a method for forming multiple liquid crystal display panels in a mother board, and separating each liquid crystal display panel from the mother board is used. Then, the TFT substrate or counter substrate formed in the mother board is thinned by polishing the mother board in which a large number of liquid crystal display panels are formed.

In the liquid crystal display panel, there is a strong demand for a small profile of the liquid crystal display panel while keeping the display area unchanged, in addition to reducing the thickness of the liquid crystal display panel. To meet this requirement, Japanese Unexamined Patent Application Publication No. 2012-32506 describes a so-called a seal-portion cutting method. In this method, a seal portion is formed across a separation line of each liquid crystal display panel in a mother board, in which one seal portion is shared by adjacent liquid crystal display panels in the mother board. Then, the seal portion is separated for each liquid crystal display panel in the cutting process.

In this case, if the sealing material is present in the cut-out portion, it is difficult to separate the liquid crystal display panels from each other. Thus, Japanese Unexamined Patent Application Publication No. 2012-32506 describes a configuration to facilitate the separation of the individual liquid crystal display panels from the mother board, by forming a columnar spacer in the cut-out portion to reduce the amount of sealing material in the cut-out portion.

SUMMARY OF THE INVENTION

FIG. 22 is a schematic plan view of a liquid crystal display panel. In FIG. 22, a counter substrate 200 is deposited on a TFT substrate 100. A liquid crystal is sealed between the TFT substrate 100 and the counter substrate 200 with a sealing material not shown. The TFT substrate 100 is made larger than the counter substrate 200. A terminal portion 150 is formed on the single layer of the TFT substrate 100 to mount an IC driver and connect a flexible wiring substrate. A display area is formed in the area where the counter substrate 200 and the TFT substrate 100 overlap with the liquid crystal sealed therebetween. FIG. 23 is a cross-sectional view taken along line D-D in FIG. 22. In FIG. 23, the liquid crystal is sealed with the sealing material, not shown, between the TFT substrate 10 and the counter substrate 200.

The liquid crystal display panel shown in FIG. 22 or 23 is formed in such a way that a large number of liquid crystal display panels are formed in a mother board and the individual liquid crystal display panels are separated from the mother board. FIG. 24 is a cross-sectional view of a method for separating the individual liquid crystal display panels from a mother board 1000. The mother board 1000 includes a mother TFT substrate in which a large number of TFT substrates 100 are formed, and a mother counter substrate in which a large number of counter substrates 200 are formed. The mother TFT substrate and the mother counter substrate are bonded together with a sealing material, not shown, therebetween. Each of the liquid crystal display panels is separated from the mother board 1000 in such a way that a scribe line 20 is formed on the mother TFT substrate or the mother counter substrate by using a scribing wheel or other suitable tool. Then, the substrate is broken by applying a bending stress to the portion of the scribe line 20.

FIG. 24 shows the state of the scribe line 20 and the break line 30 to separate each liquid crystal display panel from the mother board 1000. Here, separation lines are formed to separate one liquid crystal display panel from other liquid crystal display panels. More specifically, the scribe line 20 is formed on both sides of the TFT substrate 100 and the counter substrate 200, and the break line 30 is formed on both side of the TFT substrate 100 and the counter substrate 200. In order to form a terminal portion 150, the scribe line 20 is formed only on the side of the counter substrate 200, so that a portion of the counter substrate 200 is separated by applying a bending stress to the counter substrate 200. Thus, the terminal portion 150 is formed on the side of the TFT substrate 100.

The separation of the individual liquid crystal display panels from the mother board 1000 described above is performed after the mother TFT substrate and the mother counter substrate are made thin by polishing the mother board 1000. When the mother TFT substrate or the mother counter substrate becomes thin, it is difficult to properly perform scribing by a scribe wheel or other suitable tools, due to the warpage of the glass substrate and the like. In other words, when the glass substrate becomes thin, the warpage of the glass substrate is large, resulting in a phenomenon that the scribe wheel spins around. This problem is particularly important when the thickness of the mother TFT substrate or the mother counter substrate is reduced to about 0.15 mm.

The present invention relates to a configuration in which scribe lines are properly formed by a scribe wheel or other suitable tool in order to separate the individual liquid crystal display panels from the mother board 1000 at a high yield, when the glass substrate forming the mother board 1000 is made thin.

The present invention is to overcome the above described problem and the specific embodiments are as follows.

(1) A liquid crystal display device includes a TFT substrate in which pixels with TFTs and pixel electrodes are arranged in a matrix, and a counter substrate disposed opposite the TFT substrate. The TFT substrate and the counter substrate are bonded together by a sealing material with a liquid crystal filled inside. The TFT substrate is made larger than the counter substrate. A terminal portion is formed on a single layer of the TFT substrate. A columnar spacer or a portion of the columnar spacer is present in an end portion of the liquid crystal display device. The sealing material is present between the liquid crystal and the columnar spacer or the portion of the columnar spacer. The sealing material is not present in the end portion of the TFT substrate or the counter substrate.

(2) In the liquid crystal display device described in (1), the columnar spacer is formed on a laminated film of a black matrix, a color filter layer, an overcoat film, and the like deposited on one side of the counter substrate facing the terminal portion.

(3) A liquid crystal display device includes a TFT substrate in which pixels with TFTs and pixel electrodes are arranged in a matrix, and a counter substrate disposed opposite the TFT substrate. The TFT substrate and the counter substrate are bonded together by a sealing material with a liquid crystal filled inside. The TFT substrate is made larger than the counter substrate. A terminal portion is formed on the single layer of the TFT substrate. A columnar spacer or a portion of the columnar spacer, and the sealing material are present on three sides where the counter substrate and the TFT substrate overlap. The columnar spacer or the portion of the columnar spacer is present in an end portion on one side of the counter substrate facing the terminal portion. Then, the sealing material is present between the columnar spacer or the portion of the columnar space and the liquid crystal.

(4) In the liquid crystal display device described in (3), the columnar spacer is formed on a laminated film of a black matrix, a color filter layer, an overcoat film, and the like deposited on one side of the counter substrate facing the terminal portion.

(5) There is provided a manufacturing method of a liquid crystal display device including a liquid crystal display panel. The liquid crystal display panel includes a TFT substrate in which pixels with TFTs and pixel electrodes are arranged in a matrix, and a counter substrate disposed opposite the TFT substrate. The TFT substrate and the counter substrate are bonded by a sealing material with a liquid crystal filled inside. The TFT substrate is made larger than the counter substrate. A terminal portion is formed on a single layer of the TFT substrate. The manufacturing method includes the steps of: forming multiple liquid crystal display panels in a mother board; forming a columnar spacer corresponding to a separation line while being separated from the sealing material, in an end portion of the counter substrate on one side of the counter substrate facing the terminal portion; forming a scribe line along the separation line; and removing a portion of the mother board from the terminal portion of the TFT substrate by applying stress to the mother board.

According to the present invention, when the glass substrate of the mother board is polished to reduce the thickness, it is possible to form proper scribe lines and break lines in the mother board in which a large number of liquid crystal display panels are formed, to remove the individual liquid crystal display panels from the mother board. As a result, the liquid crystal display panel can be formed with the proper external size.

DETAILED DESCRIPTION

Hereinafter, the present invention will be described in detail with reference to exemplary embodiments.

First Embodiment

Figure 1:
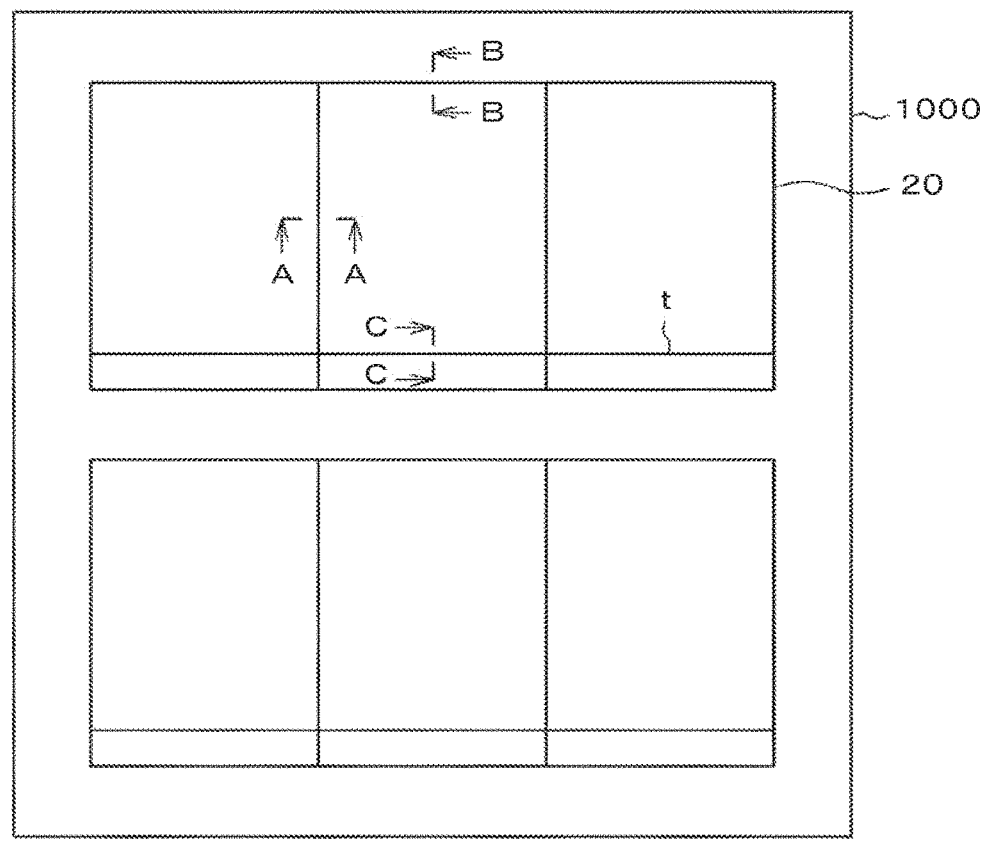
FIG. 1 is a plan view showing the layout of liquid crystal display panels in a mother board.

FIG. 1 is a plan view of a mother board 1000 in which multiple liquid crystal display panels are formed. In FIG. 1, six liquid crystal display panels are formed in the mother board 1000. However, this is an example and a large number of liquid crystal display panels are formed in the mother board in the case of small liquid crystal display panels.

In FIG. 1, scribe lines 20 are formed in the mother board 1000 to separate the individual liquid crystal display panels from each other. A scribe line t of the scribe lines 20 is formed only on the side of a counter substrate 200 to form a terminal portion 150. The other scribe lines 20 are formed on both sides of the counter substrate 200 and a TFT substrate 100 to separate one liquid crystal display panel from the other liquid crystal display panels.

Figure 2:
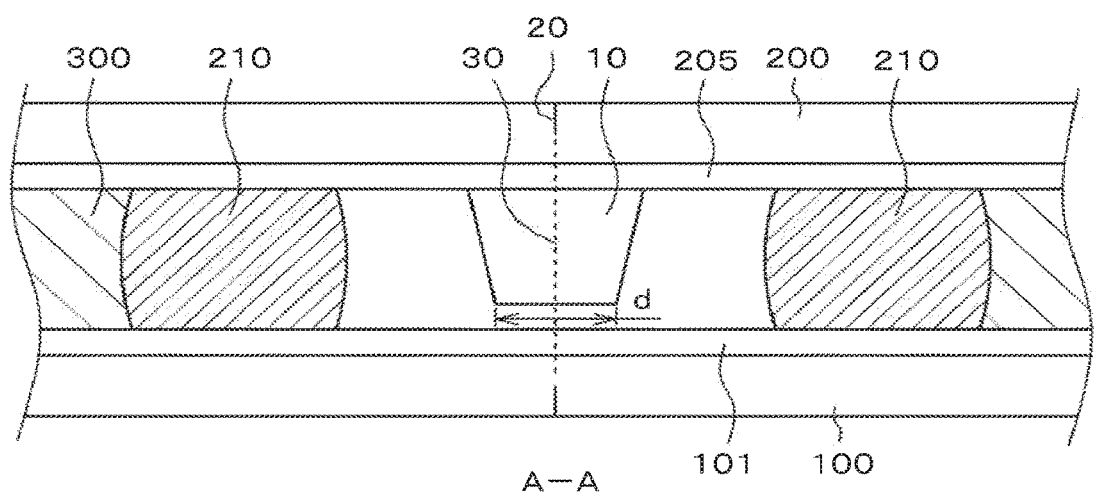
FIG. 2 is a cross-sectional view taken along line A-A in FIG. 1 according to a first embodiment.

FIG. 2 shows a cross section along line A-A in FIG. 1 according to the present embodiment. In FIG. 2, the scribe line 20 is formed in the boundary between the first and second liquid crystal display panels. A columnar spacer 10 is formed in the portion corresponding to the scribe line. The columnar spacer 10 is formed on an overcoat film 205 formed on the side of the counter substrate 200. This is the feature of the first embodiment. On the left side of the columnar spacer 10, a sealing material 210 of the first liquid crystal display panel is formed. On the right side of the columnar spacer 10, the sealing material 210 of the second liquid crystal display panel is formed.

In FIG. 2, an isolating layer 101 is formed on the TFT substrate 100. This is a laminated layer of insulating films, such as gate insulating film, interlayer insulating film, inorganic passivation film, and organic passivation film formed on the TFT substrate. The laminated layers of the insulating films vary depending on the product or the portion of the separation line, which are not essentially related to the present invention and are collectively referred to as the insulating layer 101.

A liquid crystal 300 is filled inside the sealing material 210 between the first and second liquid crystal display panels. Note that the filling method of the liquid crystal 300 includes two methods: one drop fill (ODF) and vacuum suction. FIG. 2 shows the ODF method in which the liquid crystal 300 has been filled in the mother board 1000. However, the present invention can be similarly applied to the case in which the liquid crystal 300 is filled by the vacuum suction method.

In FIG. 2, the columnar spacer 10 is formed in the portion corresponding to the scribe line 20, so that the bending strength in this portion of the mother board increases. Thus, it is possible to properly form the scribe line 20, when the thickness of the glass substrate is reduced to about 0.15 mm.

After the formation of the scribe line 20, a bending stress is applied to the TFT substrate 100 and the counter substrate 200 to separate the first and second liquid crystal display panels according to the separation line indicated by the dotted line in FIG. 2.

The columnar spacer 10 formed in the boundary between the first and second liquid crystal display panels is divided along the break line 30 from the center. The columnar spacer 10 defines the distance between the TFT substrate 100 and the counter substrate 200. A large number of columnar spacers are formed in the display area of the liquid crystal display panel. The columnar spacer 10 formed in the boundary between the first and second liquid crystal display panels in FIG. 2 is also formed at the same time when the other columnar spacers are formed in the display area.

The cross section of the columnar spacer 10 in the first embodiment is trapezoidal, in which the upper base diameter d is about 200 μm. The break line 30 is formed with accuracy within 200 μm, which is the upper base diameter of the columnar spacer 10. Thus, in the liquid crystal display panel, the sealing material 210 is present between the portion of the broken columnar spacer 10 and the liquid crystal.

Figure 3:
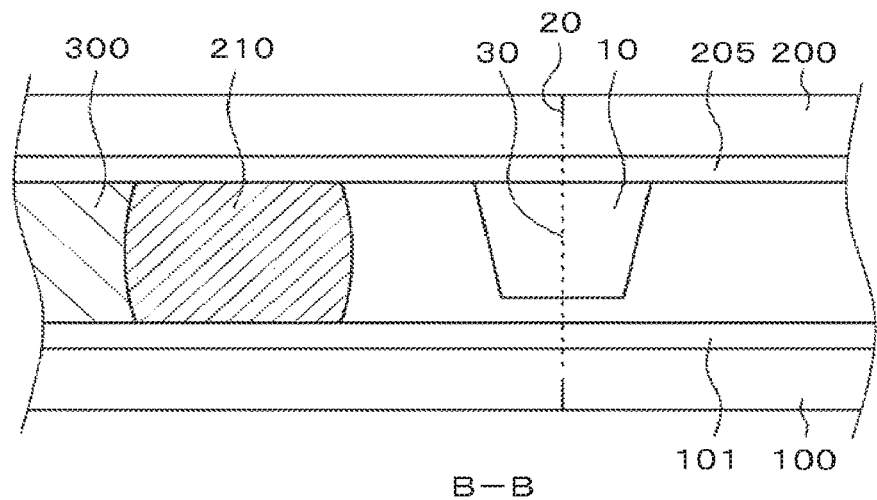
FIG. 3 is a cross-sectional view taken along line B-B in FIG. 1 according to the first embodiment.

FIG. 3 is a cross-sectional view taken along line B-B in FIG. 1 according to the present embodiment. In FIG. 3, the liquid crystal display panel is present only on the left side of the scribe line 20. Similarly to FIG. 2, the scribe line 20 is formed on both sides of the TFT substrate 100 and the counter substrate 200, and the liquid crystal display panels are separated by applying a bending stress to the TFT substrate 100 and the counter substrate 200. Also similarly to FIG. 2, the columnar spacer 10 is formed in the end portion of the liquid crystal display panel, and the scribe line 20 and the break line 30 divide the columnar spacer 10 into two parts. In this case also, the sealing material 210 is present between a portion of the divided columnar spacer 10 and the liquid crystal 300.

Figure 4:
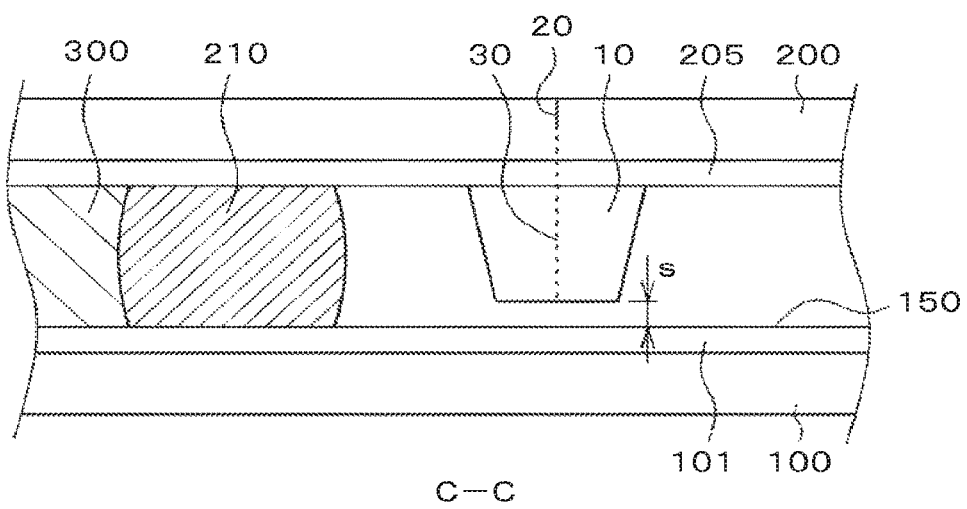
FIG. 4 is a cross-sectional view taken along line C-C in FIG. 1 according to the first embodiment.

FIG. 4 is a cross-sectional view taken along line C-C in FIG. 1 in the present embodiment. In FIG. 4, the scribe line 20 is formed only on the counter substrate 200. Then, a portion of the counter substrate 200 is separated along the break line 30 by applying a bending stress to the counter substrate 200. In this way, the terminal portion 150 is formed on the side of the TFT substrate 100. In this case also, the sealing material 210 is present between a portion of the divided columnar spacer 10 and the liquid crystal 300.

Second Embodiment

In FIG. 4 of the first embodiment, a problem arises in that the break line 30 is not properly formed in the process of separating a portion of the counter substrate 200 to form the terminal portion 150. The cross section shown in FIG. 4 according to the first embodiment is different from the cross section shown in FIG. 2 or 3, in that the scribe line t is formed only on the side of the counter substrate 200 to separate only a portion of the counter substrate 200. In other words, in FIG. 4, the break line 30 is formed in the columnar spacer 10 only from the counter substrate 200, so that a bending stress is applied only to the counter substrate 200. Thus, as shown in FIG. 4, if the columnar spacer 10 does not come into contact with the TFT substrate 100, the columnar spacer 10 and the break line 30 may not be formed at predetermined positions, or the columnar spacer 10 may not be completely divided.

Figure 5:
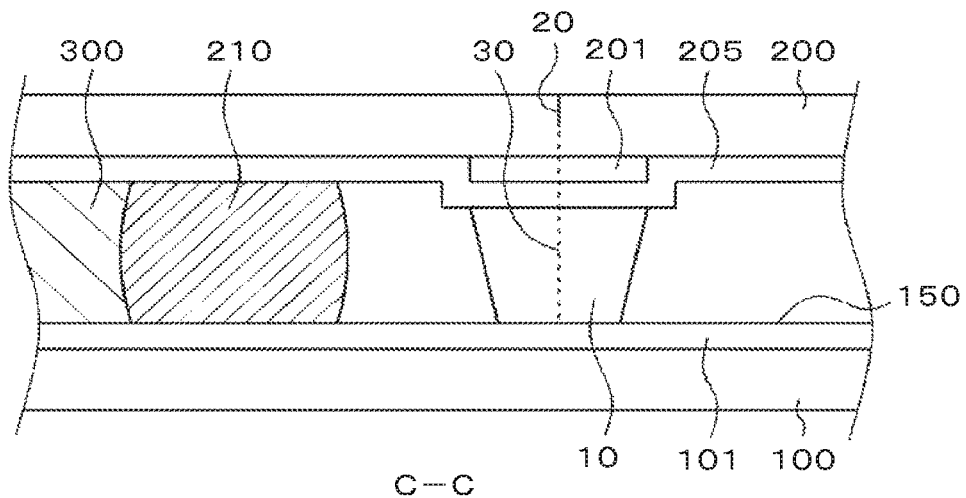
FIG. 5 is a cross-sectional view taken along line C-C in FIG. 1 according to a second embodiment.

It is found that such a phenomenon can be prevented by bring the columnar spacer 10 into contact with the TFT substrate 100. FIG. 5 is a cross-sectional view taken along line C-C in FIG. 1 according to the second embodiment. In FIG. 5, the columnar spacer 10 is formed on a black matrix 201 and an overcoat film 205. The end of the columnar spacer 10 approaches the TFT substrate 100 by the thickness of the black matrix 201, for example, about 1.5 μm.

Thus, if the distance s between the columnar spacer 10 and the TFT substrate 100 in FIG. 4 is about 1.5 μm, the end of the columnar spacer 10 can be brought into contact with the TFT substrate 100. In this way, the terminal portion 150 can be stably formed by properly removing a portion of the counter substrate 200. Note that the black matrix 201 is formed in an island shape in FIG. 5. However, this is an example and the black matrix 201 may be formed continuously from the display area.

Figure 6:
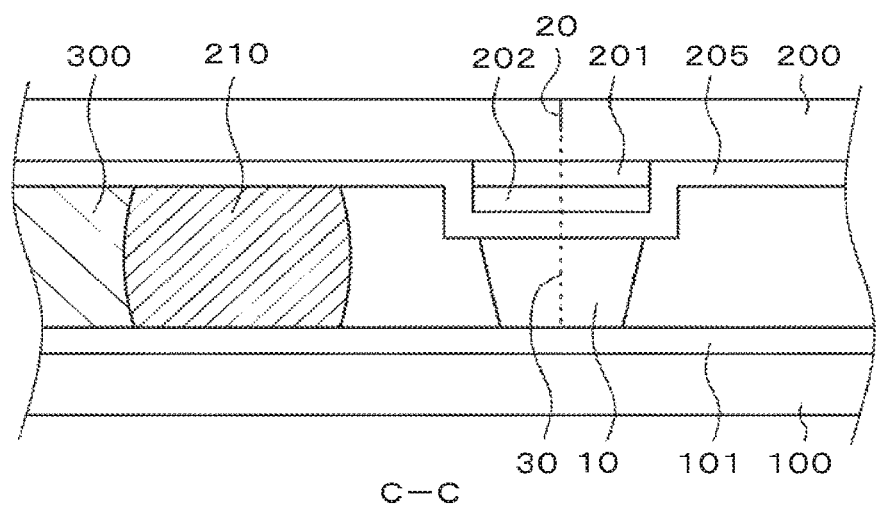
FIG. 6 is a cross-sectional view taken along line C-C in FIG. 1, which is another example of the second embodiment.

FIG. 6 shows a configuration in which the columnar space 10 and the TFT substrate 100 are brought into contact with each other, when the distance between the columnar spacer 10 and the TFT substrate 100 is larger in the portion of the scribe line 20 shown in FIG. 1. In FIG. 6, a red color filter 202 and the overcoat film 205 are deposited on the black matrix 201, on which the columnar spacer 10 is formed.

The thickness of the red color filter 202 is, for example, 2 μm and the thickness of the black matrix 201 is, for example, 1.5 μm. In this case, when the distance s between the columnar spacer 10 and the TFT substrate 100 in FIG. 4 is about 3.5 μm, the end of the columnar spacer 10 can be brought into contact with the TFT substrate 100 by the configuration shown in FIG. 6.

Figure 7:
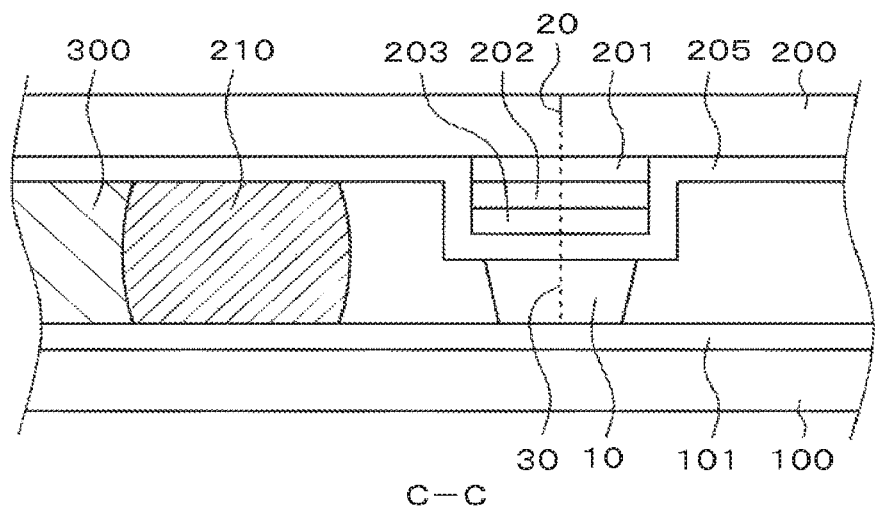
FIG. 7 is a cross-sectional view taken along line C-C in FIG. 1, which is still another example of the second embodiment.

FIG. 7 shows a configuration in which the columnar spacer 10 and the TFT substrate 100 are brought into contact with each other when the distance s between the columnar spacer 10 and the TFT substrate 100 is larger in the portion of the scribe line 20 shown in FIG. 1. In FIG. 7, the red color filter 202, a green color filter 203, and the overcoat film are deposited on the black matrix 201, on which the columnar spacer 10 is formed.

The thickness of the red color filter 202 and the green color filter 203 is, for example, 2 μm and the thickness of the black matrix is, for example, 1.5 μm. In this case, when the distance s between the columnar spacer 10 and the TFT substrate 100 is about 5.5 m, the end of the columnar spacer 10 can be brought into contact with the TFT substrate 100 by the configuration shown in FIG. 7.

Figure 8:
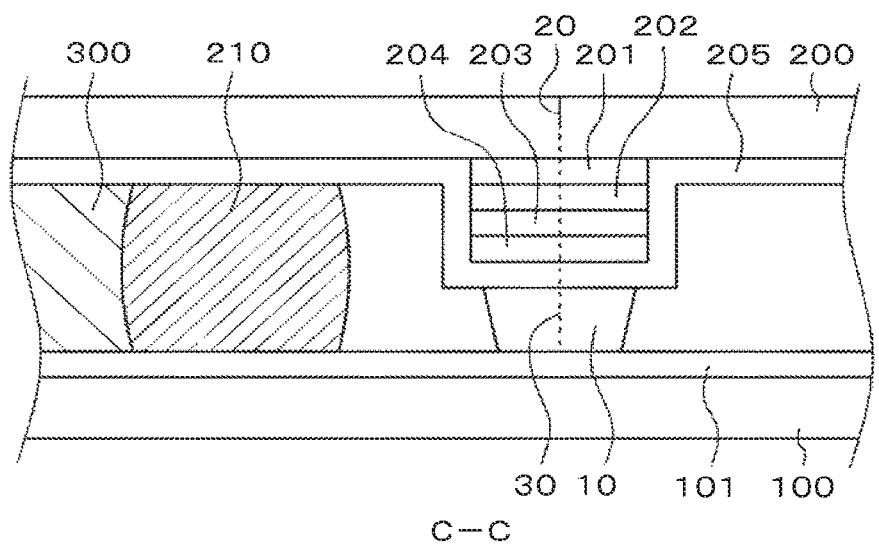
FIG. 8 is a cross-sectional view taken along line C-C in FIG. 1, which is still another example of the second embodiment.

FIG. 8 shows a configuration in which the columnar spacer 10 and the TFT substrate 100 are brought into contact with each other when the distance between the columnar spacer 10 and the TFT substrate 100 is larger in the portion of the scribe line 20 shown in FIG. 1. In FIG. 8, the red color filter 202, the green color filter 203, a blue color filter 204, and the overcoat film 205 are deposited on the black matrix 201, on which the columnar spacer 10 is formed.

The thickness of the red color filter 202, the green color filter 203, and the blue color filter 204 is, for example, 2 μm and the thickness of the black matrix is, for example, 1.5 μm. In this case, when the distance between the columnar spacer 10 and the TFT substrate 100 in FIG. 4 is about 7.5 μm, the end of the columnar spacer 10 can be brought into contact with the TFT substrate 100 by the configuration shown in FIG. 8.

Note that FIGS. 5 to 8 are examples where the color filter is formed in an island shape. However, the thickness of the island-shaped color filter may be smaller than the thickness of the color filter in the display area. In such a case, the number of layers of the color filter can be adjusted according to the need.

Third Embodiment

Particularly in the small liquid crystal display panel, there is a growing demand for a smaller external shape with the display area kept large. In this case, the frame is reduced, so that the area for forming the sealing material 210 may not be enough. In general, a small gap exists between the end portion of the glass of the liquid crystal display panel and the end portion of the sealing material 210. However, in the case of the narrow-frame product described above, the sealing portion is formed by cutting this gap.

Figure 9:
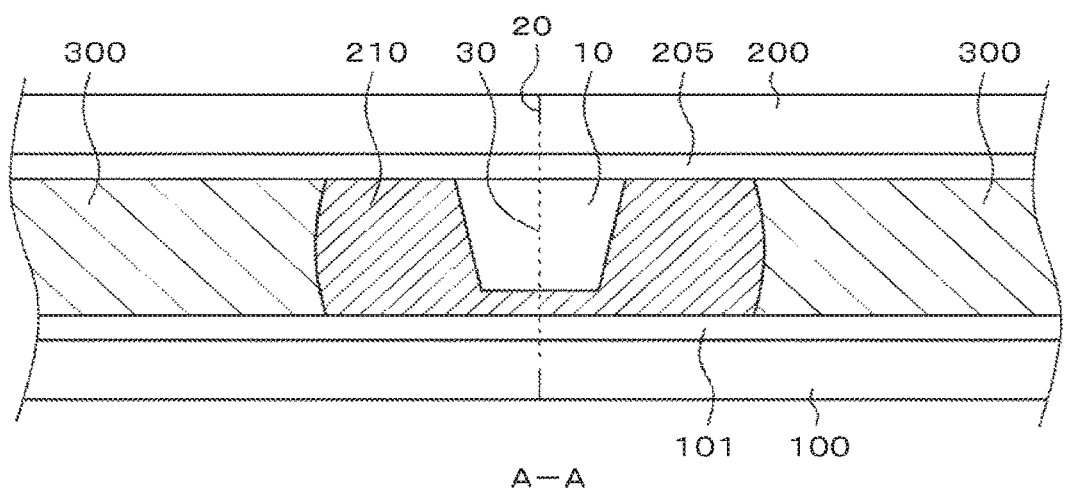
FIG. 9 is a cross-sectional view taken along line A-A in FIG. 1 in a third embodiment.

To form such a liquid crystal display panel, FIG. 9 is a cross-sectional view of the separation part between liquid crystal display panels in the mother board. FIG. 9 corresponds to the A-A cross section in FIG. 1 according to the present embodiment. When the sealing material 210 is formed on the separation line of the liquid crystal display panels, the break line 30 is not likely to form between the scribe line 20 and the scribe line 20. Thus, it is difficult to separate the liquid crystal display panels at a predetermined dimension. Thus, as shown in FIG. 9, there is provided a method for properly separating the liquid crystal display panels by forming the columnar spacer 10 at the position corresponding to the scribe line 20, and forming the break line 30 in the columnar spacer 10.

Figure 10:
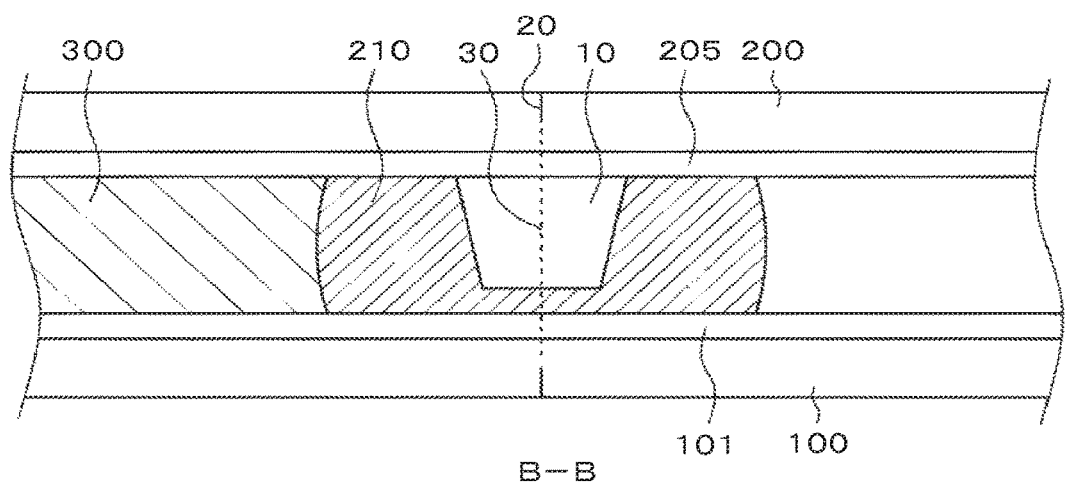
FIG. 10 is a cross-sectional view taken along line B-B in FIG. 1 according to the third embodiment.

FIG. 10 corresponds to the B-B cross section in FIG. 1 according to the present embodiment. The configuration is the same as the configuration described in FIG. 9. In FIG. 9, the liquid crystal 300 is preset on both sides of the sealing material 210. However in FIG. 10, the liquid crystal 300 is present only on the left side of the sealing material 210, because the liquid crystal display panel is not formed on the right side of the sealing material 210 in FIG. 10.

In the present embodiment, the configuration of the portion of the scribe line t in FIG. 1 is the same as the first embodiment. The scribe line 20 in FIG. 1 does not share the sealing material 210 with the adjacent liquid crystal display panel, so that the scribe line 20 or the break line 30 is not necessarily formed in the portion of the sealing material 210. Further, the columnar spacer 10 can be brought into contact with the TFT substrate 100 in the portion of the scribe line 20 in FIG. 1, by properly forming the break line 30 by using the laminated layer structure of the black matrix 201 or the color filter, which has been described in the second embodiment, in the portion of the scribe line t in FIG. 1.

Fourth Embodiment

Figure 11:
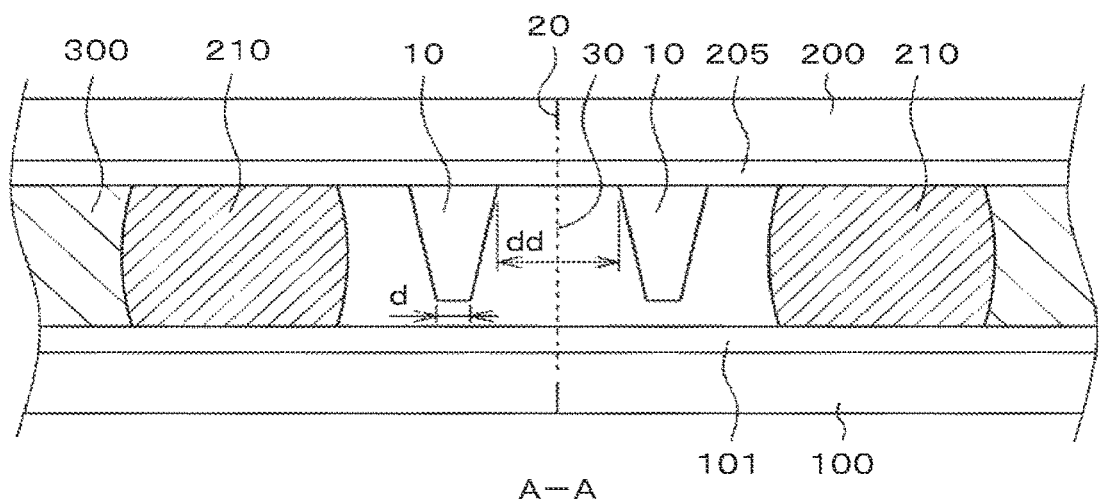
FIG. 11 is a cross-sectional view taken along line A-A in FIG. 1 according to a fourth embodiment.

FIG. 11 is a cross-sectional view taken along line A-A in FIG. 1 in a fourth embodiment according to the present invention. The present embodiment is different from the first embodiment in that two columnar spacers 10 are formed on both sides of the scribe line 20. The distance between the columnar spacer 10 and the columnar space 10, namely, the distance dd shown in FIG. 11 is 200 μm. The scribe line 20 and the break line 30 are formed in this region.

The cross section of the columnar spacer in FIG. 11 is also trapezoidal. However, the width of the trapezoid is smaller than that of the columnar spacer 10 in the first to third embodiments. The upper base diameter d of the trapezoid in FIG. 11 is, for example, 10 μm. The rest of the configuration is the same as the configuration of FIG. 2. The effect of this configuration is the same as the effect described in the first embodiment. In other words, in FIG. 11, since the columnar spacer 10 is formed on both sides of the scribe line 20, the bending strength of the mother board increases in this portion. Thus, when the thickness of the glass substrate is reduced to about 0.15 μm, it is possible to properly form the scribe line 20 and the break line 30.

In the present embodiment, the break line 30 is not present in the columnar spacer 10. The columnar spacer 10 according to the present embodiment can also be formed at the same time when the other columnar spacers are formed in the display area. The sealing material 210 is present between the columnar spacer 10 and the liquid crystal 300 also in the liquid crystal display panel formed by the configuration of FIG. 11.

Figure 12:
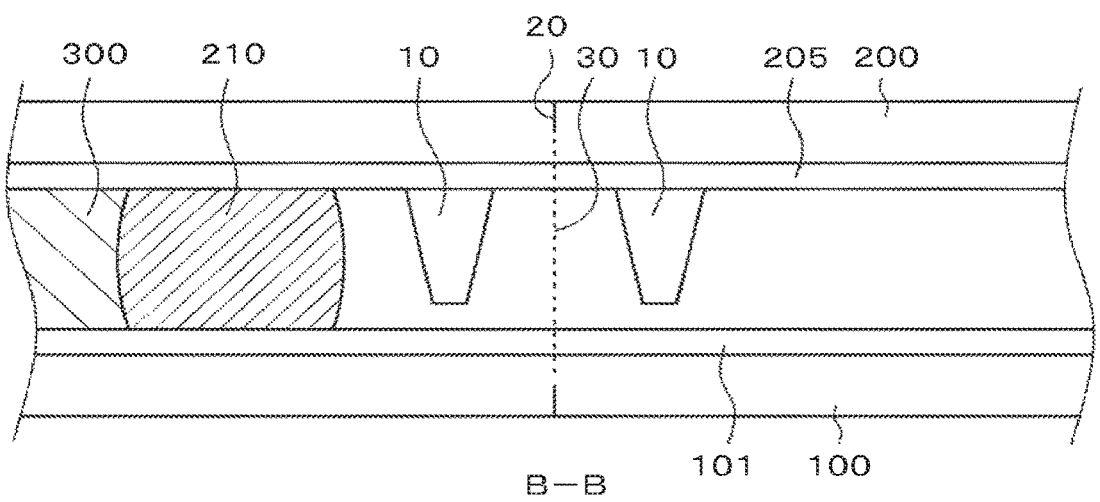
FIG. 12 is a cross-sectional view taken along line B-B in FIG. 1 according to the fourth embodiment.

FIG. 12 is a cross-sectional view taken along line B-B in FIG. 11 according to the fourth embodiment. The configuration in FIG. 12 is the same as the configuration in FIG. 3 in the first embodiment, except that the scribe line 20 is formed between the two columnar spacers 10. In this case also, the sealing material 210 is present between the columnar spacer 10 and the liquid crystal 300.

Figure 13:
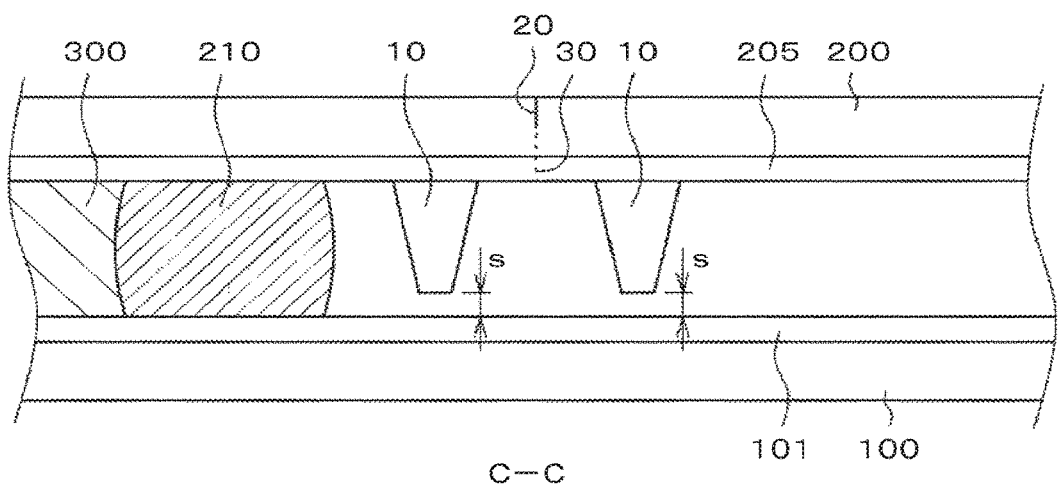
FIG. 13 is a cross-sectional view taken along line C-C in FIG. 1 according to the fourth embodiment.

FIG. 13 is a cross-sectional view corresponding to the C-C cross section in FIG. 1 according to the present embodiment. In FIG. 13, unlike FIGS. 11 and 12, the scribe line 20 and the break line 30 are formed only on the side of the counter substrate 200. The configuration of FIG. 13 is the same as the configuration of FIG. 4 in the first embodiment, except that the scribe line 20 is formed between the two columnar spacers 10. In this case also, the sealing material 210 is present between the columnar spacer 10 and the liquid crystal 300.

Fifth Embodiment

In FIG. 13 according to the fourth embodiment, a problem arises in that the break line 30 is not properly formed in the process of separating a portion of the counter substrate to form the terminal portion 150. This is the same as described in the second embodiment. This problem can be solved by bringing the end of the two columnar spacers 10 into contact with the TFT substrate 100. The method for this is the same as described in the second embodiment.

Figure 14:
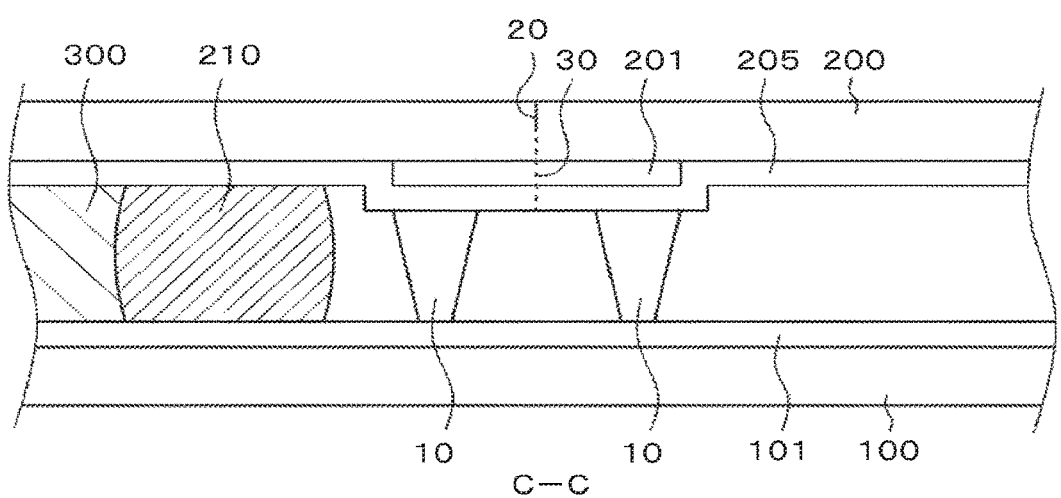
FIG. 14 is a cross-sectional view taken along line C-C in FIG. 1 according to a fifth embodiment.

FIG. 14 shows when the two columnar spacers 10 are formed on the laminated film of the black matrix 201 and the overcoat film 205. With this configuration, for example, the columnar spacers 10 can be brought into contact with the TFT substrate 100 when the distance s between the columnar spacers 10 and the TFT substrate 100 is about 1.5 µm in FIG. 13.

Figure 15:
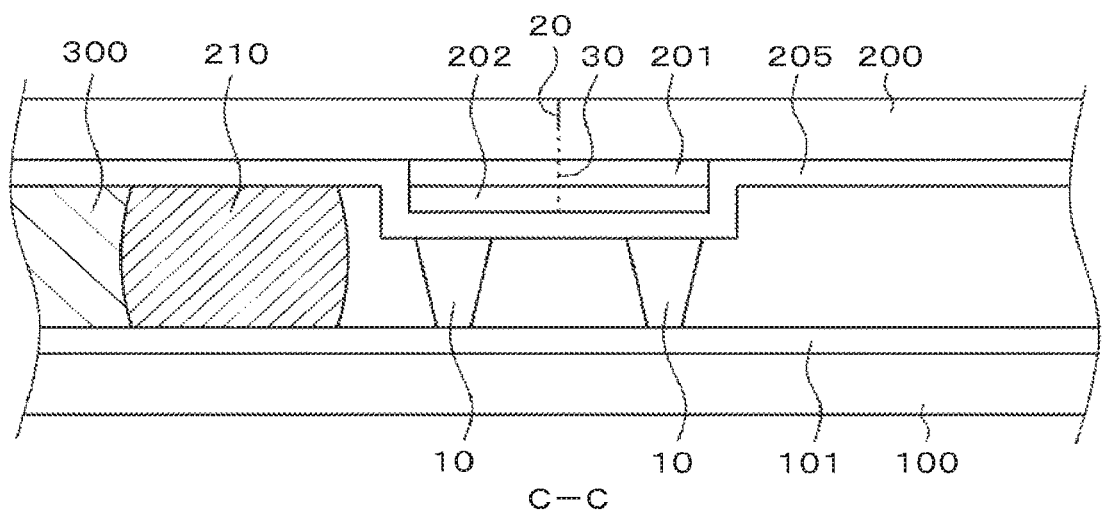
FIG. 15 is a cross-sectional view taken along line C-C in FIG. 1, which is another example of the fifth embodiment.

FIG. 15 shows a configuration in which the two columnar spacers 10 are brought into contact with the TFT substrates 100 when the distance s between the end of the columnar spacers 10 and the TFT substrate 100 increases further. In FIG. 15, the two columnar spacers 10 are formed on the black matrix 201, the red color filter 202, and the overcoat film 205. With this configuration, the columnar spacers 10 can be brought into contact with the TFT substrate 100, so that a portion of the counter substrate 200 can be properly separated to form the terminal portion 150.

Figure 16:
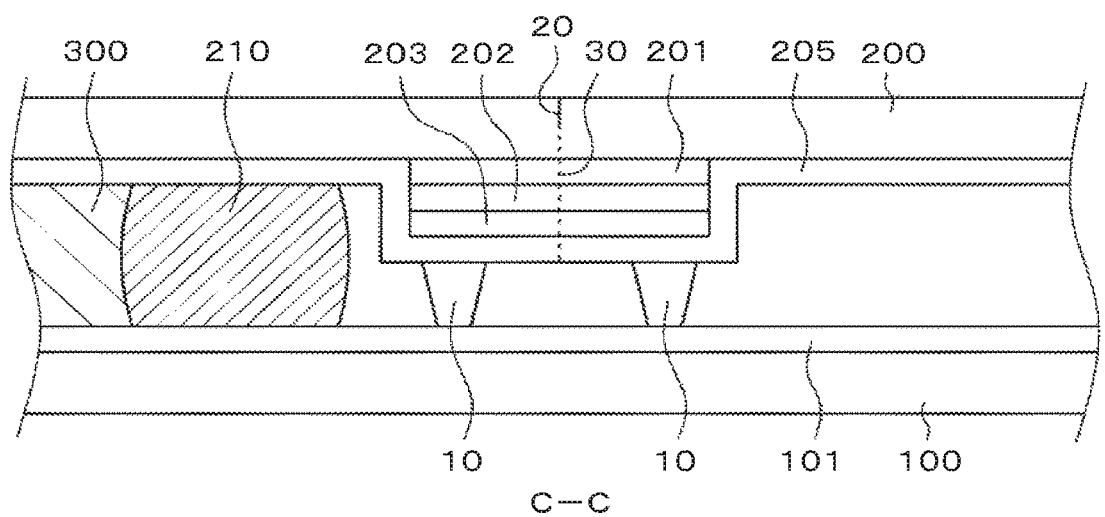
FIG. 16 is a cross-sectional view taken along line C-C in FIG. 1, which is still another example of the fifth embodiment.

FIG. 16 shows a configuration in which the two columnar spacers 10 are brought into contact with the TFT substrate 100 when the distance s between the end of the columnar spacers 10 and the TFT substrate 100 increases further. In FIG. 16, the two columnar spacers 10 are formed on the black matrix 201, the red color filter 202, the green color filter 203, and the overcoat film 205. With this configuration, the columnar spacers 10 can be brought into contact with the TFT substrate 100, so that a portion of the counter substrate 200 can be properly separated to form the terminal portion 150.

Figure 17:
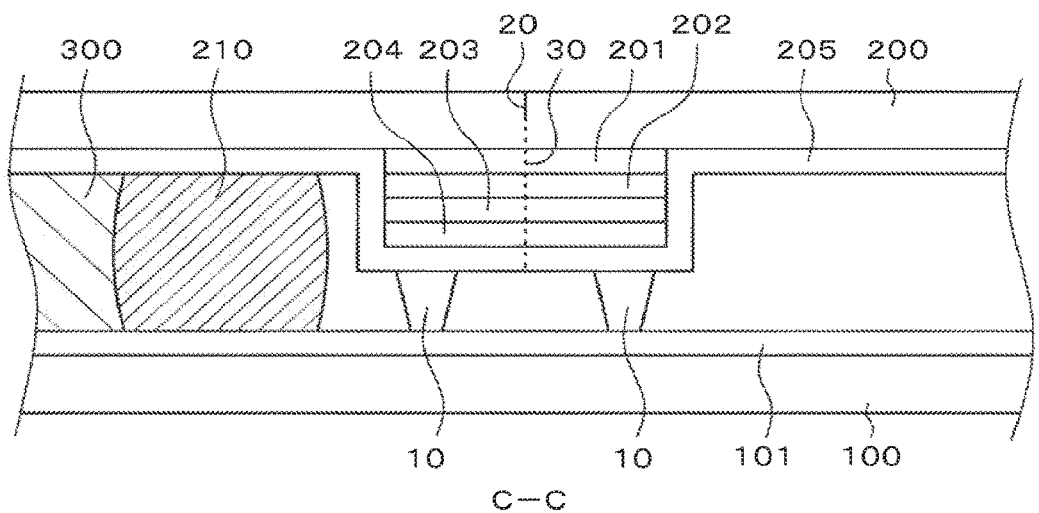
FIG. 17 is a cross-sectional view taken along line C-C in FIG. 1, which is still another example of the fifth embodiment.

FIG. 17 shows a configuration in which the two columnar spacers 10 are brought into contact with the TFT substrate 100 when the distance s between the end of the columnar spacers 10 and the TFT substrate increases further. In FIG. 17, the two columnar spacers 10 are formed on the black matrix 201, the red color filter 202, the green color filter 203, the blue color filter 204, and the overcoat film 205. With this configuration, the columnar spacers 10 can be brought into contact with the TFT substrate 100, so that a portion of the counter substrate 200 can be properly separated to form the terminal portion 150.

Note that in FIGS. 14 to 17, the color filter is formed in an island shape. However, the thickness of the island-shaped color filter may be smaller than the thickness of the color filter in the display area. In such a case, the number of layers of the color filter can be adjusted according to the need.

Sixth Embodiment

Figure 18:
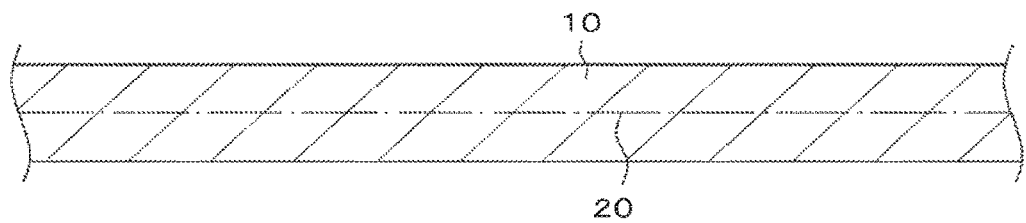
FIG. 18 is a plan view of a columnar spacer, as seen from the side of the counter substrate according to the first to third embodiments.
Figure 19:
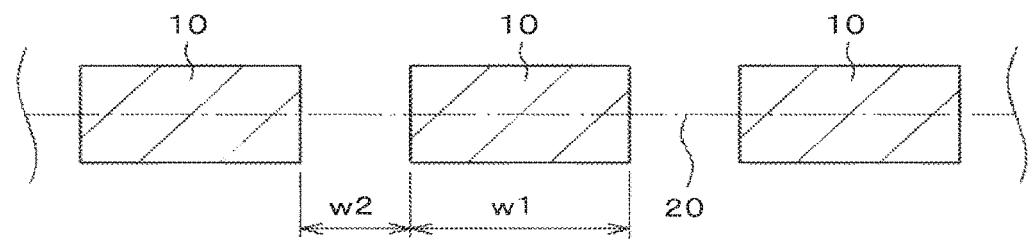
FIG. 19 a plan view of the columnar spacer, as seen from the side of the counter substrate according to the first to third embodiments.

In the first to fifth embodiments, the description has been made with reference to only the cross section of the columnar spacer 10. FIG. 18 is a plan view of the columnar spacer 10 corresponding to the first to third embodiments, as seen from the side of the counter substrate 200, in which the columnar spacer 10 is continuously formed on the scribe line 20. FIG. 19 is a plan view of another example of the columnar spacer 10 corresponding to the first to third embodiments, as seen from the side of the counter substrate 200 in which the columnar spacer 10 is separately formed on the scribe line 20. The effects in FIGS. 18 and 19 are the same. In the case of FIG. 19, the effect may be diminished if the distance w2 between the columnar spacers 10 is large. Thus, the distance w2 between the columnar spacers 10 is preferably smaller than the width w1 of the columnar spacer 10.

Figure 20:
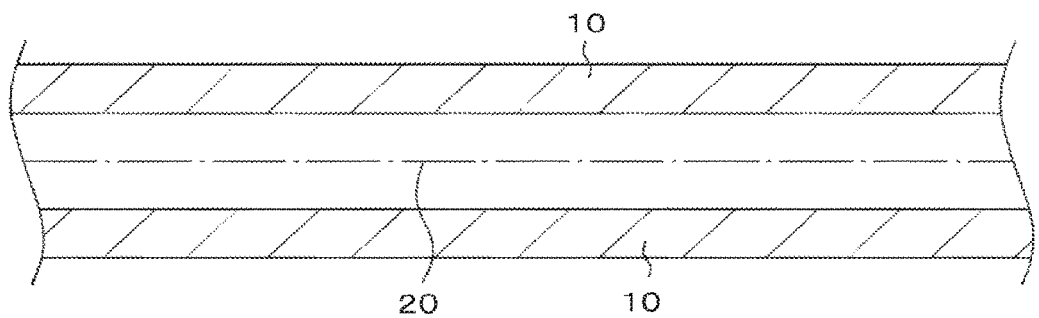
FIG. 20 is a plan view of a columnar spacer, as seen from the side of the counter substrate according to the fourth and fifth embodiments.
Figure 21:
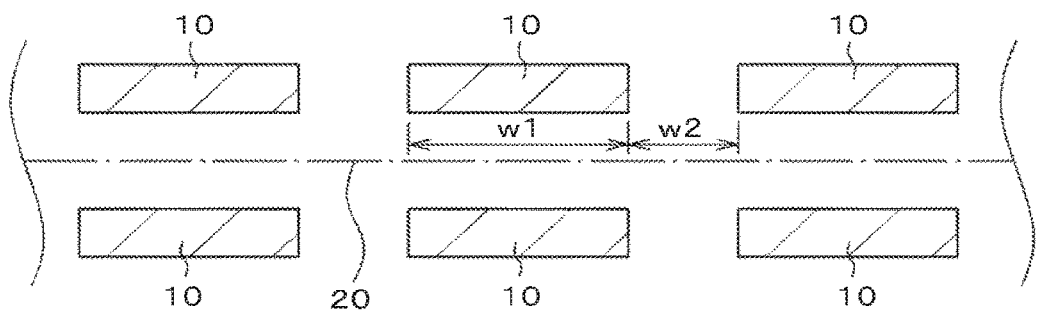
FIG. 21 is a plan view of another example of the columnar spacer, as seen from the side of the counter substrate according to the fourth and fifth embodiments.
Figure 22:
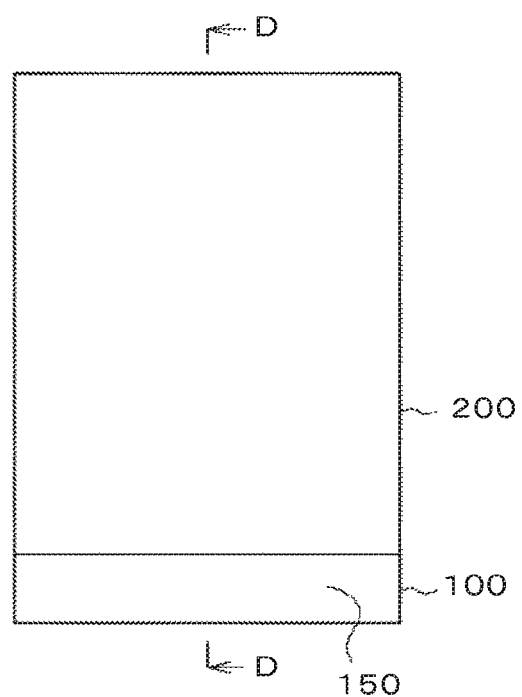
FIG. 22 is a schematic plan view of the liquid crystal display panel.
Figure 23:
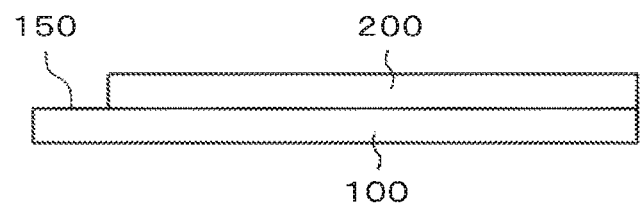
FIG. 23 is a cross-sectional view taken along line D-D in FIG. 22.
Figure 24:
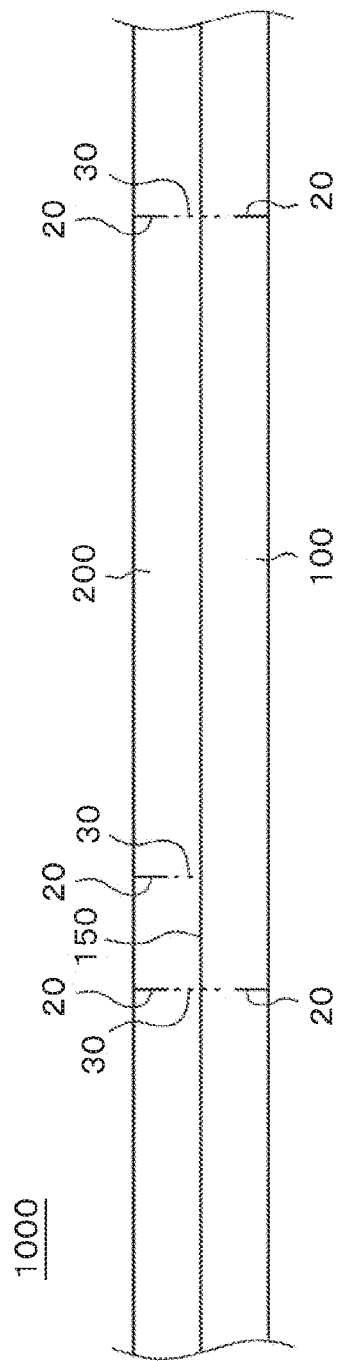
FIG. 24 is an example of scribe lines and break lines to separate the liquid crystal display panels from the mother board.

FIG. 20 is a plan view of the columnar spacer 10 corresponding to the fourth and fifth embodiments, as seen from the side of the counter substrate 200 in which two columnar spacers 10 are continuously formed on both sides of the scribe line 20. FIG. 21 is a plan view of another example of the columnar spacer 10 corresponding to the fourth and fifth embodiments, as seen from the side of the counter substrate 200 in which two columnar spacers 10 are separately formed on both sides of the scribe line 20. The effects in FIGS. 20 and 21 are the same. In the case of FIG. 21, the effect may be diminished if the distance w2 between the columnar spacers 10 is large. Thus, the distance w2 between the columnar spacers 10 is preferably smaller than the width w1 of the columnar spacer 10.

What is claimed is:

1. A liquid crystal display device comprising:
a TFT substrate;
a plurality of pixels formed on the TFT substrate in a display area;
an outer circuit is mounted on the TFT substrate in a terminal portion;
a counter substrate opposed to the TFT substrate except at the terminal portion;
a black matrix layer formed on the counter substrate;
a color filter layer formed on the black matrix layer;
spacers, comprising a first spacer and a second spacer, formed between the TFT substrate and the counter substrate; and
a sealing material bonding the TFT substrate and the counter substrate,
wherein
the counter substrate comprises a first end and a second end,
the first end is located between the sealing material and the terminal portion, and extend in a first direction, the second end is connected to the first end, and extend in a second direction crossing the first direction, the first spacer is located between the first end and the sealing material, and the second spacer is located between the second end and the display area, the second spacer overlaps with the sealing material and a part of the sealing material is located between a top of the second spacer and the TFT substrate, and the first spacer overlaps with a laminated film of the black matrix layer and the color filter layer and a top of the first spacer is in contact with the TFT substrate.

2. The liquid crystal display device according to claim 1, wherein the first spacer is not in contact with the sealing material.

3. The liquid crystal display device according to claim 2, wherein the sealing material is not located between the top of the first spacer and the TFT substrate.

4. The liquid crystal display device according to claim 1, further comprising an overcoat layer formed on the color filter layer,
wherein the first spacer overlaps with a laminated film of the black matrix layer, the color filter layer, and the overcoat layer.

5. The liquid crystal display device according to claim 1, wherein the spacers further comprising a third spacer,
the counter substrate further comprises a third end which is opposed to the second end and extend in the second direction and connected to the first end,
the third spacer is located between the display area and a third end, and
a part of the sealing material located between a top of the third spacer and the TFT substrate.

6. The liquid crystal display device according to claim 1, wherein the second spacer is aligned in line with an interval of a distance w2 along the second end,
a width of the second spacer along the second end is w1, and
w1 is greater than w2.

7. The liquid crystal display device according to claim 1, wherein the first spacer is aligned in line with an interval of a distance w2 along the first end,
a width of the first spacer along the first end is w1, and
wherein w1 is greater than w2.

8. The liquid crystal display device according to claim 1, wherein the laminated film has two or more color filter layers.

9. The liquid crystal display device according to claim 1, further comprising an insulation layer formed on the TFT substrate,
wherein the sealing material is provided on the insulation layer,
the part of the sealing material is located between the top of the second spacer and the insulation layer.

10. The liquid crystal display device according to claim 9, wherein the insulation layer includes a plurality of insulation films, and
thin film transistors are located between corresponding the insulation films.

11. The liquid crystal display device according to claim 10,
wherein the plurality of insulation films have a gate insulation film, an interlayer insulation film, an inorganic passivation film, and an organic passivation film.

* * * * *